(12) United States Patent
Hsu et al.

(10) Patent No.: US 10,955,748 B2
(45) Date of Patent: Mar. 23, 2021

(54) CURVED SHAPED MASK, CURVED DEVICE HAVING COLOR RESISTS PATTERN AND METHOD FOR MANUFACTURING THE SAME

(71) Applicants: Ming-An Hsu, Chubei (TW); Wen-Fu Lin, Miaoli County (TW)

(72) Inventors: Ming-An Hsu, Chubei (TW); Wen-Fu Lin, Miaoli County (TW)

(*) Notice: Subject to any disclaimer, the term of this patent is extended or adjusted under 35 U.S.C. 154(b) by 377 days.

(21) Appl. No.: 15/211,935

(22) Filed: Jul. 15, 2016

(65) Prior Publication Data

US 2017/0017160 A1    Jan. 19, 2017

(30) Foreign Application Priority Data

Jul. 16, 2015  (TW) ................. 104123106
Jul. 16, 2015  (TW) ................. 104211483

(51) Int. Cl.
*B32B 17/06*   (2006.01)
*G03F 7/40*   (2006.01)
*G03F 7/16*   (2006.01)
*G03F 7/20*   (2006.01)
*G03F 7/32*   (2006.01)

(52) U.S. Cl.
CPC .............. *G03F 7/40* (2013.01); *B32B 17/061* (2013.01); *G03F 7/16* (2013.01); *G03F 7/168* (2013.01); *G03F 7/2002* (2013.01); *G03F 7/32* (2013.01); *B32B 2255/28* (2013.01); *B32B 2307/412* (2013.01)

(58) Field of Classification Search
CPC ............. G02F 1/133509; G02F 1/1335; G02F 1/133516; G02F 1/133512; G02F 1/133514
USPC ............................................ 345/173
See application file for complete search history.

(56) References Cited

U.S. PATENT DOCUMENTS

| | | | | |
|---|---|---|---|---|
| 5,631,111 A * | 5/1997 | Niu | ......... | C25D 13/12 430/7 |
| 2008/0227507 A1* | 9/2008 | Joo | ...... | H04M 1/0266 455/575.8 |
| 2012/0026107 A1* | 2/2012 | Kim | ......... | G06F 3/044 345/173 |
| 2013/0082961 A1* | 4/2013 | Wang | ...... | G06F 3/044 345/173 |
| 2013/0328806 A1* | 12/2013 | Tsai | ......... | G06F 3/041 345/173 |
| 2014/0063361 A1* | 3/2014 | Lo | ............ | G06F 1/16 349/12 |

* cited by examiner

*Primary Examiner* — Alicia J Sawdon
(74) *Attorney, Agent, or Firm* — Muncy, Geissler, Olds & Lowe, P.C.

(57) ABSTRACT

The disclosure illustrates a curve-shaped mask, a curved device having color resist pattern and method for manufacturing the same. The curved device includes a curved substrate and at least two color resist layers. The at least two color resist layers are formed on the curved substrate, and construct a visible pattern together. The curved device is manufactured by a curve-shaped mask, which is a metal-containing material layer formed on the curved substrate and is visible.

6 Claims, 7 Drawing Sheets

CURVED SHAPED MASK, CURVED DEVICE HAVING COLOR RESISTS PATTERN AND METHOD FOR MANUFACTURING THE SAME

BACKGROUND OF THE INVENTION

1. Field of the Invention

The present disclosure relates to a color resist, and more particularly to a curve-shaped mask, a curved device having color resist pattern and method for manufacturing the same.

2. Description of the Related Art

Currently, smart devices including smartphones, smart watches and intelligent medical apparatus, are provided with large screens to facilitate users to view information shown on the screens. In addition to the large screens and strong functions, shape designs of these devices have increasing trend to personalized and beautiful performances in appearance, shape and color, and the desired improvement can be realized by a fantastic outer shell design and production. The outer shell with curved surface is particularly attractive and gradually becomes future trend of the smart device.

In recent year, the way for manufacturing the pattern on the curved outer shell of the smart device can be divided into several manners. The first manner is transfer printing technology. A planar pattern is prepared in advance and then printed on the curved surface of the target by manner of transfer printing. The first manner has an advantage of low cost in production process, but disadvantages of slow process speed, high cost in material, and low resolution of circuit. The second manner is inkjet plus laser engraving technologies. Dyestuff is sprayed on the curved surface of the target by manner of inkjet, and the laser engraving is performed to engrave the pattern. The second manner has disadvantages of high cost in production process, processing apparatus and material, and slow process speed, but has an advantage of high resolution of circuit up to 20 um (micron).

Therefore, what is need to develop the method for manufacturing color pattern on the curved outer shell of the smart device with advantages of low cost in production process and material, high process speed and high resolution of circuit.

SUMMARY OF THE INVENTION

In order to achieve aforesaid objective, the present disclosure is to provide a curve-shaped mask, a curved device having color resist pattern and method for manufacturing the same, to achieve effects of low cost in process and material, fast process speed, and high resolution of circuit, so as to solve the conventional technical problems of speed process speed, high cost in material and low resolution of circuit.

The present disclosure provides a curved device having color resist pattern. The curved device includes a curved substrate and at least two color resist layers formed on the curved substrate. The at least two color resist layers construct a visible pattern together.

The present disclosure further provides a curve-shaped mask including a curved glass substrate and a metal-containing material layer formed on the curved glass substrate. The metal-containing material layer constructs a curve-shaped mask pattern which is visible.

The present disclosure further provides a method of forming a curved color resist pattern, and the method includes steps of: in sequential order, using spraying manner to form at least two color resist layers which construct a color resist composite layer, on a curved substrate; performing an exposure process on the color resist composite layer, by a curve-shaped mask which has a predetermined pattern; removing a part of the color resist composite layer other than the predetermined pattern, so as to form the color resist pattern; and curing the color resist composite layer.

BRIEF DESCRIPTION OF THE DRAWINGS

The detailed structure, operating principle and effects of the present disclosure will now be described in more details hereinafter with reference to the accompanying drawings that show various embodiments of the present disclosure as follows.

DETAILED DESCRIPTION OF THE PREFERRED EMBODIMENTS

Reference will now be made in detail to the exemplary embodiments of the present disclosure, examples of which are illustrated in the accompanying drawings. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. These embodiments are provided so that this disclosure will be thorough and complete, and will fully convey the inventive concept to those skilled in the art. The relative proportions and ratios of elements in the drawings may be exaggerated or diminished in size for the sake of clarity and convenience in the drawings, and such arbitrary proportions are only illustrative and not limiting in any way. The same reference numbers are used in the drawings and the description to refer to the same or like parts.

It will be understood that, although the terms 'first', 'second', 'third', etc., may be used herein to describe various elements, these elements should not be limited by these terms. The terms are used only for the purpose of distinguishing one component from another component. Thus, a first element discussed below could be termed a second element without departing from the teachings of embodiments. As used herein, the term "or" includes any and all combinations of one or more of the associated listed items.

According to the embodiment, the present disclosure is to provide a curved device having color resist pattern and the method for manufacturing the same. In the embodiment, by manner of forming multiple layers of color resist first and performing the exposure process once, the pattern can be manufactured on curved shell body with advantages of high-resolution, low cost and high production capacity.

Please refer to FIGS. 1A, and 3A-3G which respectively show flowcharts of an embodiment of the method for manufacturing color resist pattern of the present disclosure. The method can be applied to manufacture a curved substrate for the cell phone shown in FIG. 2, and includes main steps below.

Figure 1A:
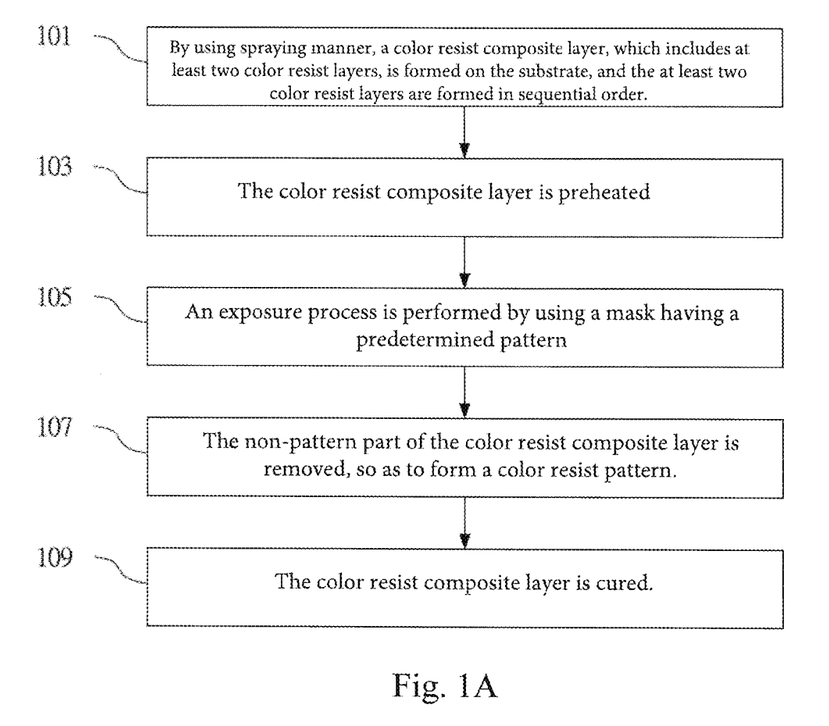
FIG. 1A is a flowchart of an embodiment of method for manufacturing the color resist pattern of the present disclosure.

In a step 101, by using spraying manner, a color resist composite layer including at least two color resist layers, is formed on a curved substrate, and the at least two color resist layers are formed in sequential order. The spraying manner is to enable the each of color resist layers to have better uniformity. Preferably, the curved substrate can be curved glass substrate, curved plastic substrate, or curved ceramic substrate.

Figure 2:
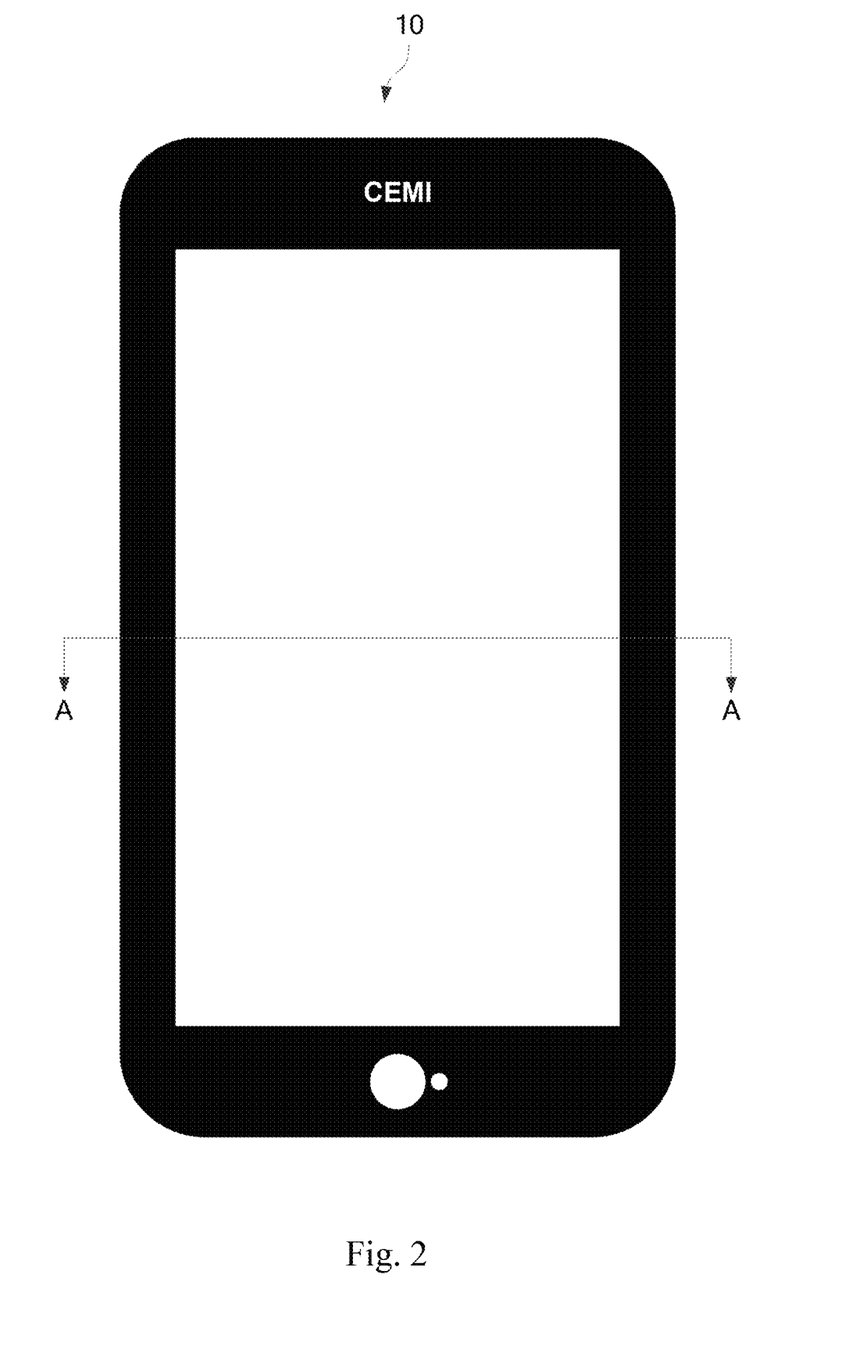
FIG. 2 is a top view of curved substrate of cell phone manufactured by the method of manufacturing the color resist pattern, in accordance with the present disclosure.

The embodiment shown in FIGS. 3A to 3G, which are sectional views taken along line A-A of FIG. 2, is taken as an example for explaining the steps of the method for manufacturing the pattern of the curved substrate 10 for cell phone shown in FIG. 2. Particularly, in the embodiment, the method for manufacturing the color resist pattern on the curved substrate is described with explanation of special technology of applying the composite resist layer including multiple resist layers and applying the exposure process once. The colors of color resists can be fitted with each other upon demand. For example, when the pattern is desired to be presented in white color, the first color resist layer can be white, the second color resist layer can be gray or black, and the third color resist layer (the topmost layer) is transparent; when the pattern is desired to be presented in black color for simplest requirement, the first color resist layer can be black and the second color resist layer can be transparent. The topmost color resist layer can be transparent to prevent the substrate from being scratched and improve protection.

In other words, the color resists of the present disclosure mean the color resists with various colors, such as white, red, orange, yellow, green, blue, indigo, purple, black, or transparent (colorless). The operator can select the color from the color series with which the color resist can be formed. The colors with various color tones can be created by multiple color layers. In addition, the photoresist material can be positive photoresist or negative photoresist, to achieve the desired technical effect of the present disclosure. Each of the color resist layers has thickness ranged from 0.5 micron to 30 micron.

Figure 3A:
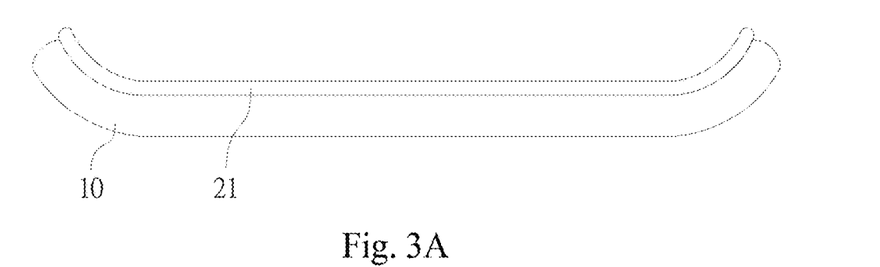
FIGS. 3A to 3G are schematic views of flows of a particular embodiment of the method for manufacturing the color resist pattern of the present disclosure.
Figure 3B:
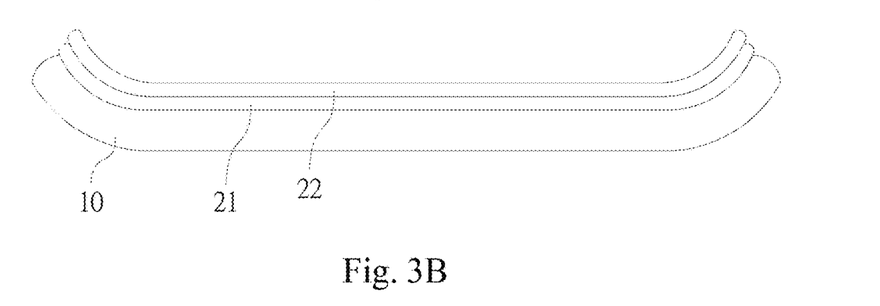
Figure 3C:
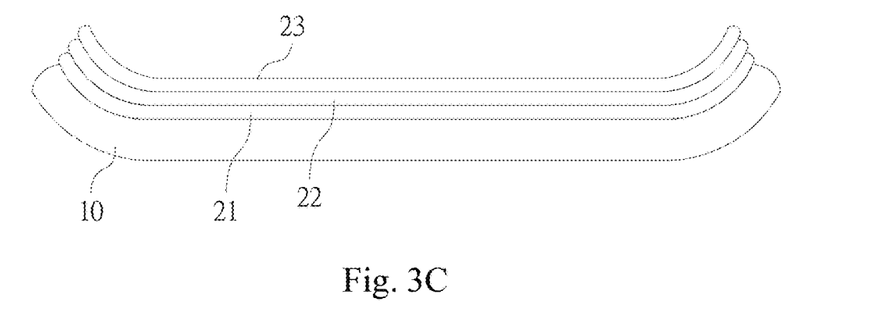

Please refer to FIGS. 3A to 3C which respectively show steps of forming the color resist composite layer, in the method for manufacturing color resist pattern according to the present disclosure. In the embodiment, a color resist composite layer including three layers, is formed. Three color resist layers 21, 22 and 23 are respectively formed on the curved substrate 10, and the color resist layer 23 is the topmost layer and can be implemented by transparent color resist.

In a step 103, the color resist composite layer is preheated. The preheating procedure can remove the solvent remained in the photoresist, so as to reduce the flowability and improve uniformity of the color resist composite layer without being deformed easily. The preheating process is performed under a temperature ranged from 70° C. to 120° C., and the temperature and time for reheating process can be adjusted upon property of the material.

In a step 105, an exposure process is performed by using a curve-shaped mask having a predetermined pattern. The pattern of the curve-shaped mask is the pattern desired to be formed on the curved substrate, such as an annular rectangular frame pattern of the screen for the smart device. On the curved substrate, the pattern is an annular rectangular curved surface. This kind of pattern has a linewidth larger than 10 microns; in other words, the resolution of the pattern is up to 10 micron.

Figure 3D:
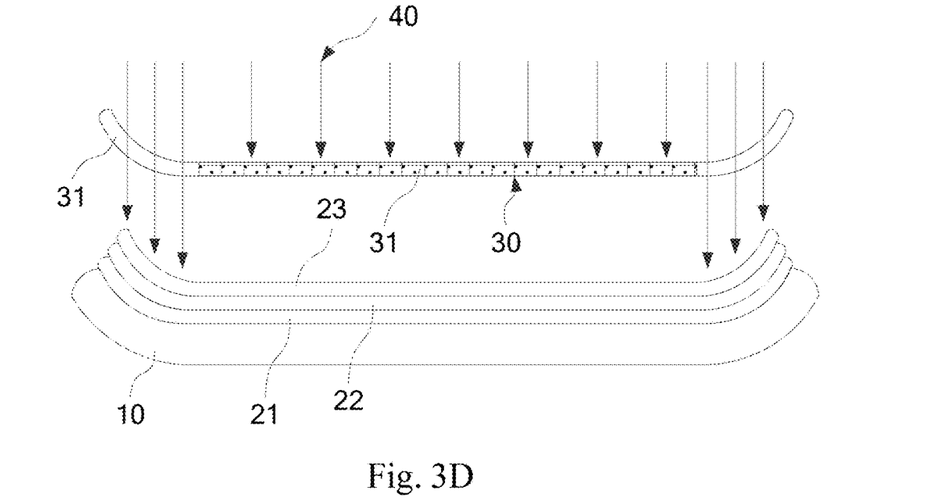
Figure 3E:
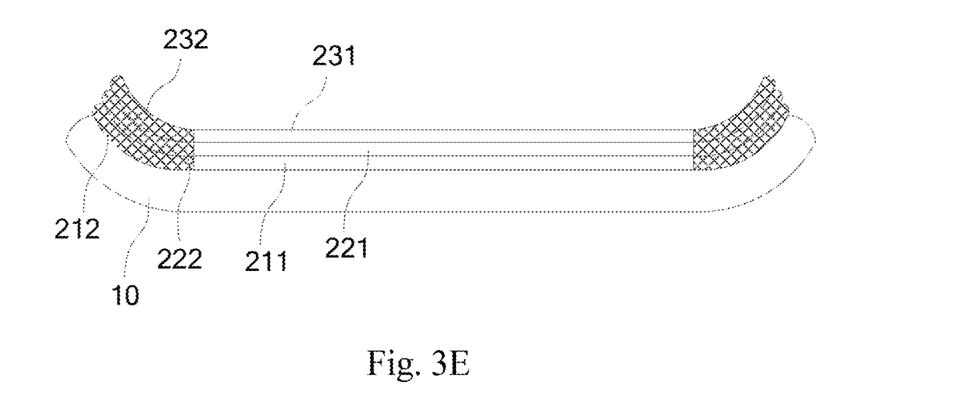

Please refer to FIGS. 3D to 3E. In this embodiment, the negative photoresist material is applied to be the photoresist material for the color resist layer, so the exposed area is the part of the color resist to be remained on the curved substrate 10. The curved substrate is irradiated by ultraviolet light 40 through the curve-shaped mask 30 having the predetermined pattern. The curve-shaped mask 30 has a pattern part 31 which is transparent, and a non-pattern part 32 which is non-transparent, so that the part to be formed with the predetermined pattern is exposed to form the exposed color resist layers 212, 222 and 232, and the unexposed color resist layers 211, 221 and 231 at the same time. The negative photoresist is applied in present embodiment, so the unexposed color resist layers 211, 221 and 231 are dissolved by developer to be removed latter; in contrast, when the positive photoresist material is applied, the predetermined pattern of the mask 30 must be inversed and the exposed color resist layer is dissolved by the developer to be removed.

Figure 3F:
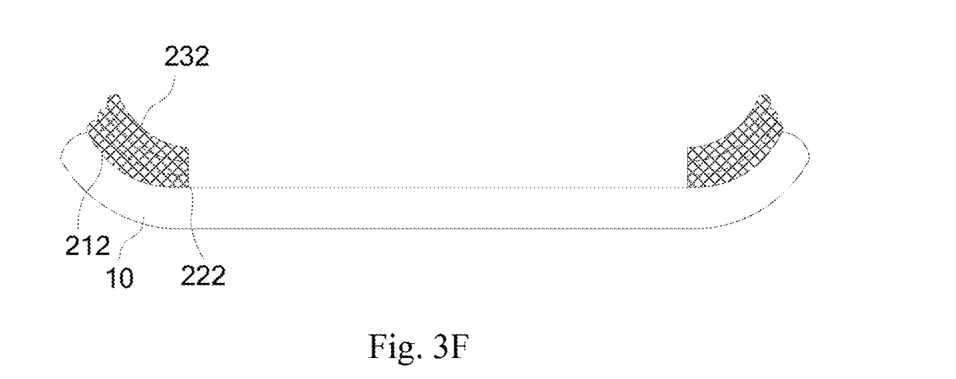

In a step 107: the non-pattern part of the color resist composite layer is removed, so that a color resist pattern is formed. This step is aforesaid development step, that is, the developer is formulated for the photoresist material of the color resist. After being processed by the developer, the unexposed color resist layers 211, 221 and 231 are removed from the curved substrate. The exposure process and removal process are parts of the lithography process which is a well-known technology of semiconductor process, so their detailed descriptions are omitted. After these two processes are completed, the predetermined pattern of the present disclosure can be obtained. After this step, the unexposed color resist layers 211, 221 and 231 are removed and only the exposed color resist layers 212, 222 and 232 are remained, as shown in FIG. 3F.

In a step 109, the color resist composite layer is cured. In this embodiment, the low-temperature baking method is used to cure the predetermined pattern by a temperature ranged from 100° C. to 180° C. The baking time of the baking process can be adjusted upon actual situation, for example, upon properties, thickness or desired hardness of the cured color resist layer. The hardness of the cured color resist layer is ranged from 2H to 4H.

Figure 3G:
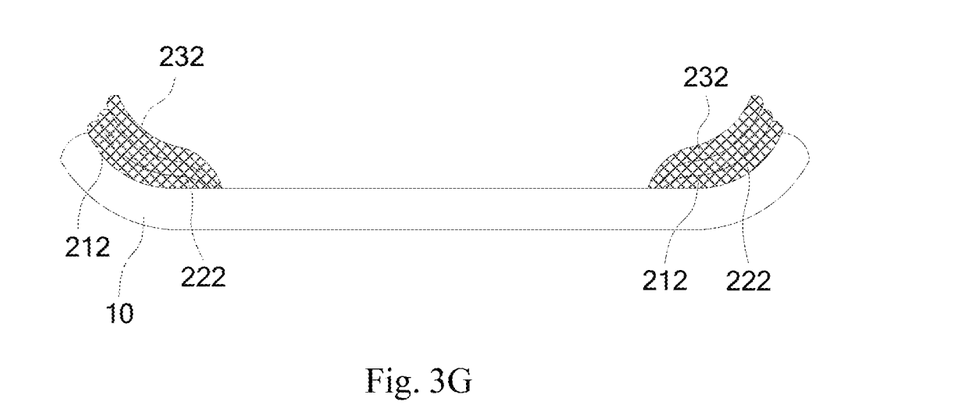

During the baking process of the step 109, because of the multilayer structure of the color resist layer applied in the present disclosure, the color resists may become flowable during the baking process to form a special ramp structure, so that the topmost color resist may contact the curved substrate. As shown in FIG. 3G, the color resist layers 212, 222 and 232 of the pattern part form the ramp structure due to the flowability occurred during the baking process, so that the color resist layers 212, 222 and 232 all contact the curved substrate 10. The multilayer structure of the color resist layers is applied in the present disclosure, so the special structure is formed by just the exposure and the baking process once, and such process of forming the ramp structure is a second feature of the present disclosure.

The first feature of the present disclosure is that the desired pattern can be generated by just performing the exposure process and removal process on the multilayer of the color resist composite layer once, so as to significantly reduce the production time and cost. In addition, the photolithography applied in the present disclosure can also improve the resolution of the pattern.

Figure 1B:
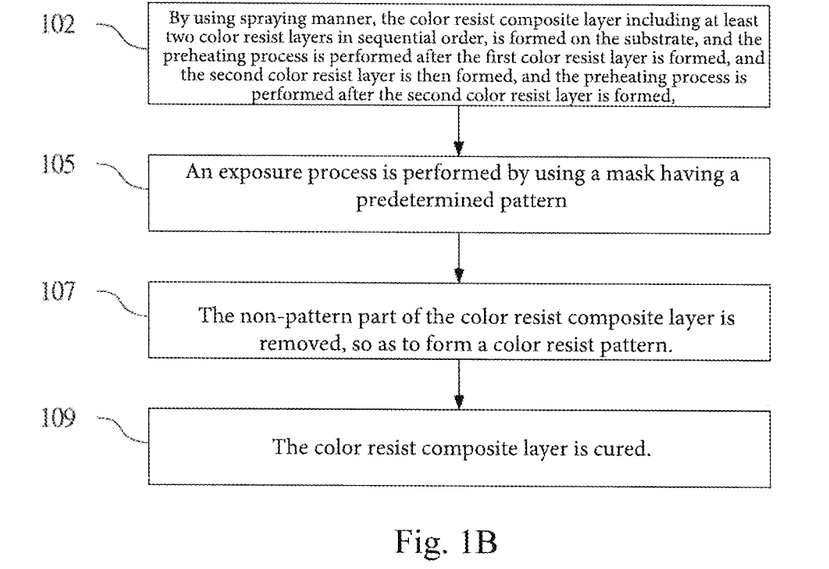
FIG. 1B is a flowchart of other embodiment of method for manufacturing the color resist pattern of the present disclosure.

Please refer to FIG. 1B which shows a flowchart of other embodiment of method for manufacturing the color resist pattern of the present disclosure. The curved substrate of the cell phone shown in FIG. 2 can be manufactured according to steps shown in FIG. 1B. Compared with the embodiment shown in FIG. 1A, difference between present embodiment and the previous embodiment is that present embodiment further includes a step 102 of using spraying manner to form the color resist composite layer including at least two color resist layers in sequential order, on the curved substrate, and performing the preheating process after the first color resist layer is formed, and then forming the second color resist layer and performing the preheating process after the second color resist layer is formed, and so forth. This step can reduce the flowability of the color resist composite layer after each color resist layer is formed, so as to improve the uniformity the color resist composite layer without being deformed easily. As a result, the color resist layers have interfaces obviously separated from each other.

The embodiment shown in FIG. 1A applies the preheating process once, and the embodiment shown in FIG. 1B applies preheating process by multiple times. These two embodiments have different effects for meeting demands of various clients, so both are embraced in the present disclosure.

For exemplary explanation, the curve-shaped mask 30 shown in FIG. 3D is performed by the proximity exposure process. Other embodiments applying the contact exposure process will be described below, and cases of using negative photoresist material and positive photoresist material are illustrated respectively.

Figure 4A:
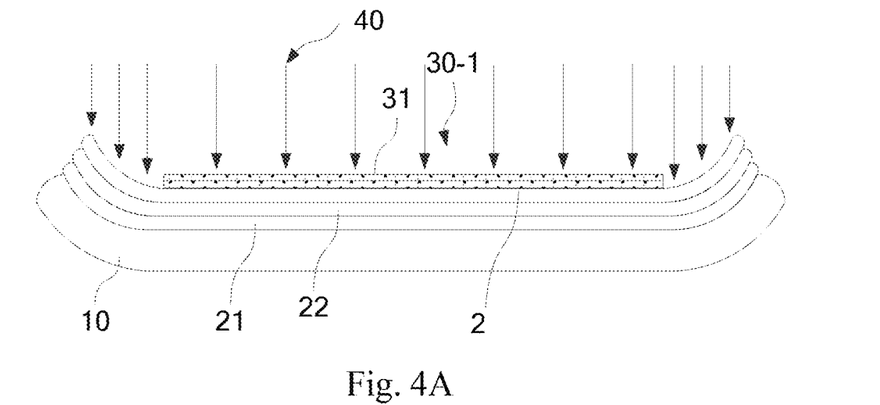
FIG. 4A is a sectional view of other particular embodiment of the curve-shaped mask for the color resist pattern of the present disclosure.
Figure 4B:
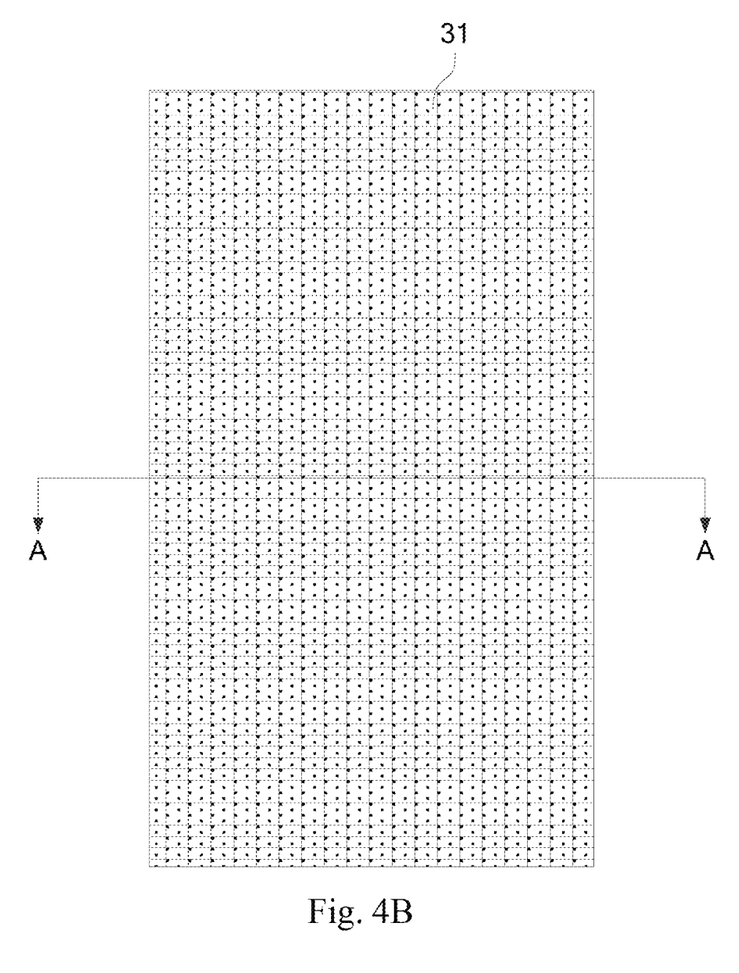
FIG. 4B is a top view of other particular embodiment of the curve-shaped mask for the color resist pattern of the present disclosure.

Please refer to FIG. 4A which shows a sectional view of other particular embodiment of the curve-shaped mask for the color resist pattern of the present disclosure, and FIG. 4B which shows a top view of the curve-shaped mask 30-1. Using the mask of FIG. 4B to perform the contact exposure process of FIG. 4A can improve the resolution of the pattern. In addition, the negative photoresist material is applied in present embodiment, so the central portion of the curve-shaped mask 30-1 is substantially a rectangular mask sheet, and the curved substrate 10 has two curved sides and a planar area other than the curved sides. Therefore, whole curve-shaped mask 30-1 is in a planar shape; in other words, the curve-shaped mask of the present disclosure means a mask capable of being used on the curved substrate, but not limited to a mask having curved surface.

Figure 5A:
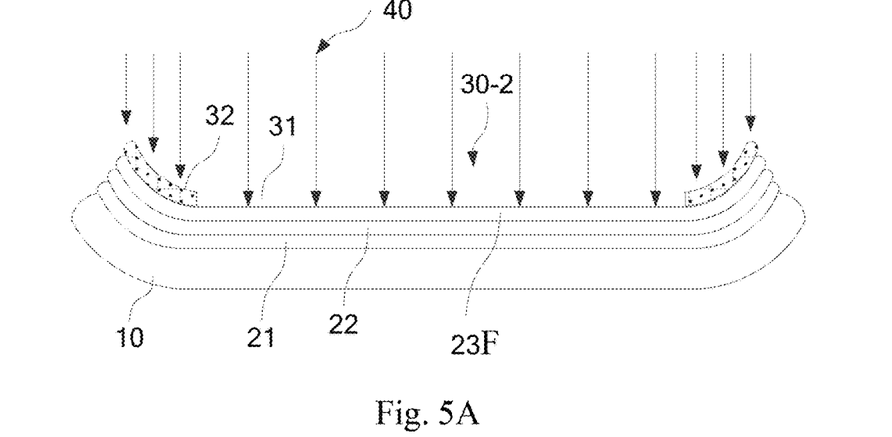
FIG. 5A is a sectional view of another particular embodiment of the curve-shaped mask for the color resist pattern of the present disclosure.
Figure 5B:
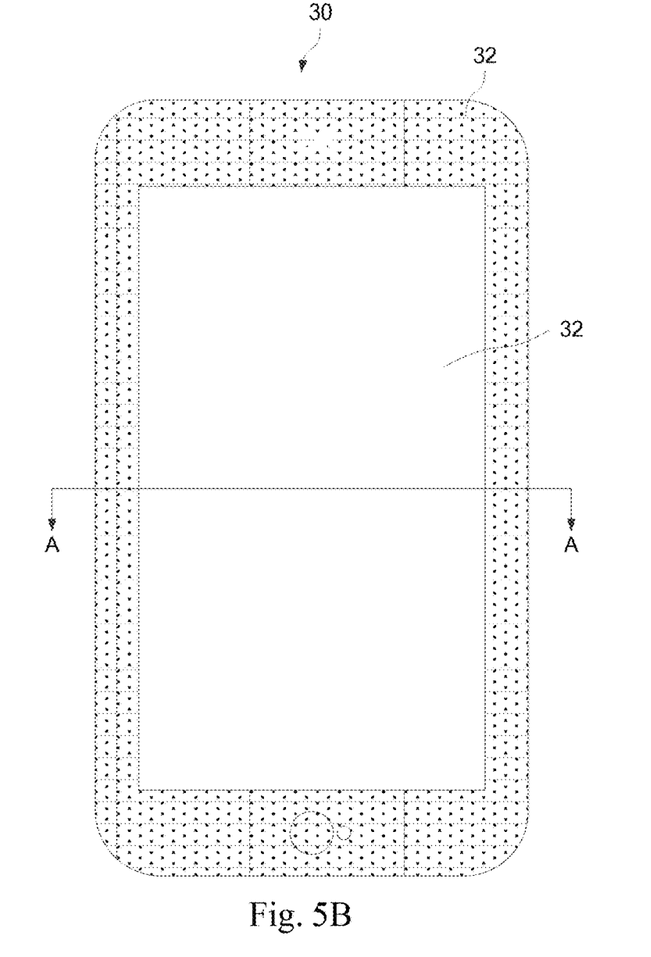
FIG. 5B is a top view of another particular embodiment of the curve-shaped mask for the color resist pattern of the present disclosure.

However, in the embodiment shown in FIGS. 5A and 5B, the whole shape of the curve-shaped mask 30-2 equates to the shape of the curved substrate 10, this is because that the positive photoresist material is applied in the embodiment in FIGS. 5A and 5B.

In other words, the shape of the curve-shaped mask can be adjusted upon the shape of the curved substrate and the photoresist material (positive or negative photoresist material). The purpose of adjusting the shape of the curved substrate is to obtain the desired pattern. Preferably, the substrate of the curve-shaped mask can be the curved glass substrate, and the material of the mask pattern can be a metal-containing material layer, such as titanium nitride, chrome-containing material, or Mo—Si material.

Figure 6:
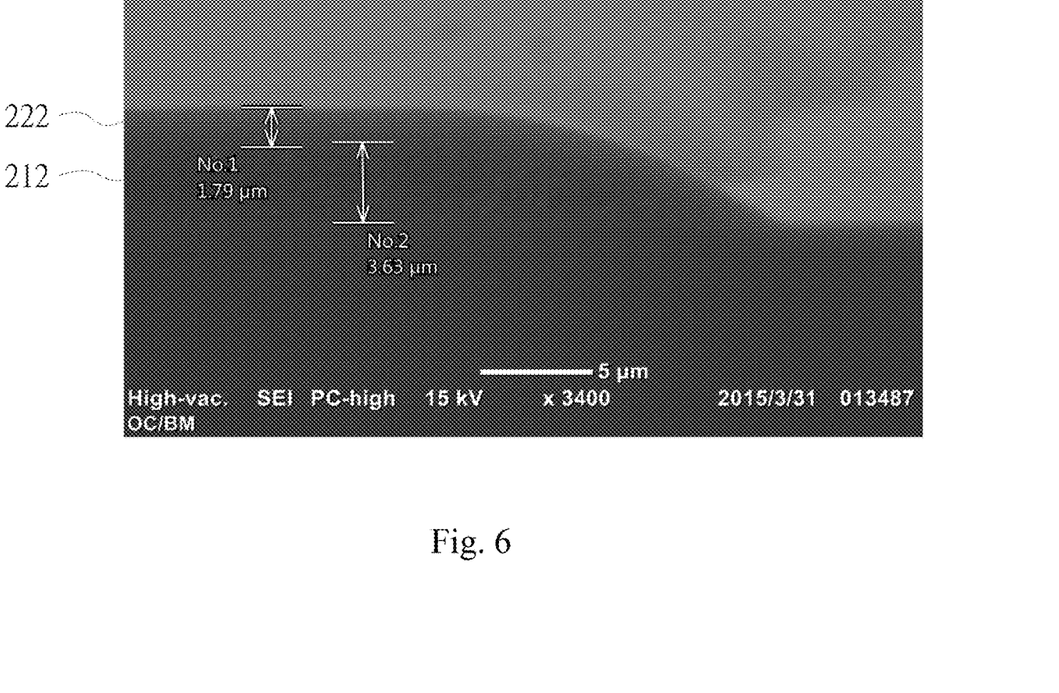
FIG. 6 is a sectional view of a scanning electron micrograph of the color resist pattern of the present disclosure.

Please refer to FIG. 6 which shows a sectional view of a scanning electron micrograph of the color resist pattern of the present disclosure. It is obvious that edge parts of the exposed color resist layers 212 and 222 obviously construct the ramp structure. Furthermore, thicknesses of the exposed color resist layers 212 and 222 are 3.63 micron and 1.79 micron respectively, so that the required amount of photoresist material can be reduced significantly to decrease the cost in material. This is the third feature of the present disclosure.

According to the present disclosure, the method of forming the color resist pattern can be applied to manufacture a curved device with the color resist pattern, and the device includes the curved substrate and the at least two color resist layers formed on the curved substrate. Both of the at least two color resist layers construct the visible pattern together, that is, the pattern formed by the least two color resist layers has visible appearance. By manner of applying the photolithography process, the pattern of the present disclosure has high resolution and uses less material. In addition, at the boundary of the pattern, the at least two color resist layers (that is, the color resist composite layer) construct the ramp structure and each contacts the curved substrate.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A curved device having a color resist pattern, comprising:
    a curved substrate; and
    at least two color resist layers formed on a surface of the curved substrate, constructing a visible pattern together, each of the color resist layers having a first end directly contacting the surface of the curved substrate and a second end at an edge of the curved substrate,
    wherein the at least two color resist layers curve upwardly from the first end continuously toward the second end, and
    wherein the curved device is manufactured by a curve-shaped mask, which is a metal-containing material layer formed on the curved substrate and is visible.

2. The curved device according to claim 1, wherein the at least two color resist layers further comprise a topmost layer disposed on the at least two color resist layers, and
    wherein the topmost layer is a transparent resist layer.

3. The curved device according to claim 1, wherein the hardnessess of each of the at least two color resist layers is ranged from 2H to 4H after being cured.

4. The curved device according to claim 1, wherein the curved substrate is a curved glass substrate, a curved plastic substrate or a curved ceramic substrate.

5. The curved device according to claim 1, wherein the metal-containing material layer comprises titanium nitride, a chrome-containing material or a molybdenum silicon material.

6. A curved device having a color resist pattern, comprising:
  a curved substrate; and
  at least two color resist layers formed on an exterior surface of the curved substrate, each of the color resist layers having a first end directly contacting the exterior surface of the curved substrate and a second end at an edge of the curved substrate,
  wherein the at least two color resist layers curve upwardly from the first end continuously toward the second end.

* * * * *